United States Patent
Aoyama et al.

[11] Patent Number: 5,925,174
[45] Date of Patent: Jul. 20, 1999

[54] COMPOSITION AND PROCESS FOR TREATING THE SURFACE OF COPPER-CONTAINING METALS

[75] Inventors: Masayuki Aoyama; Ryoji Morita, both of Hiratsuka; Jyun Kawaguchi, Sagamihara, all of Japan

[73] Assignee: Henkel Corporation, Gulph Mills, Pa.

[21] Appl. No.: 08/930,080

[22] PCT Filed: May 14, 1996

[86] PCT No.: PCT/US96/06549

§ 371 Date: Nov. 14, 1997

§ 102(e) Date: Nov. 14, 1997

[87] PCT Pub. No.: WO96/36747

PCT Pub. Date: Nov. 21, 1996

[30] Foreign Application Priority Data

May 17, 1995 [JP] Japan ..................................... 7-142656

[51] Int. Cl.[6] ........................... C23C 22/05; C23C 22/48; C23C 22/52
[52] U.S. Cl. ....................... 106/14.42; 148/248; 148/251; 148/259; 148/260; 148/274
[58] Field of Search ..................................... 148/248, 251, 148/274, 259, 260; 106/14.42

[56] References Cited

PUBLICATIONS

Derwent Abstract #89-336606/46, abstract of Japanese Specification No. 01-251785, Oct. 1989.

Derwent Abstract No. 93-129239/16, abstract of Japanese Patent Specification No. 05-065466, Mar. 1993.

*Primary Examiner*—Anthony Green
*Attorney, Agent, or Firm*—Wayne C. Jaeschke; Norvell E. Wisdom, Jr.; Wayne C. Jaeschke, Jr.

[57] ABSTRACT

An aqueous liquid composition for treating the surface of copper-containing metals is a dispersion and/or solution in water and organic solvent, at least one silane coupling agent having a functional moiety selected from vinyl, mercapto, amino and glycidyloxy moieties bonded to one carbon atom in the silane coupling agent and other epoxy moieties bonded to two adjacent carbon atoms in the silane coupling agent and at least one copper inhibitor compound selected from azoles, azines, aromatic secondary amines, and aromatic diacylhydrazides. Treatment with this composition provides excellent migration resistance, an excellent solder resistance, and a very durable adhesiveness to a variety of copper containing metal surfaces.

20 Claims, No Drawings

COMPOSITION AND PROCESS FOR TREATING THE SURFACE OF COPPER-CONTAINING METALS

TECHNICAL FIELD

This invention relates to a composition and process for treating a surface of copper-containing metal. More particularly, this invention relates to a surface treatment composition and process that are well suited to the purpose of imparting migration resistance, solder resistance, and robust adhesiveness to the surface of copper-containing metals.

BACKGROUND ART

Copper is in wide use, ranging from decorative and ornamental applications to its applications in the electronic industry, and like most other metals it undergoes oxidation when exposed to the air. This causes a decline in its solderability and electrical conductivity, which has prompted the implementation of various countermeasures.

For example, in the electronics industry this deterioration in solderability and electrical conductivity of the copper foil used for printed circuit boards has been prevented by inhibiting oxidation of the copper surface by the application thereto of an organic inhibitor as a surface treatment.

However, the recent direction in the electronics industry has been toward lighter, thinner, smaller, and higher-performing components, and this has required printed circuit boards to support higher densities and smaller conductor paths. This in turn has increased the requirements in the areas of solder wettability, solder resistance, durability of adhesion to the copper foil, and migration resistance of the copper. These issues are usually handled by inducing an improvement in these properties by directly treating the surface of the copper foil with an antioxidant or copper inhibitor or by adding an antioxidant or copper inhibitor to the adhesive.

For example, Japanese Patent Application Laid Open [Kokai or Unexamined] Number Hei 1-251785 [251,785/1989] discloses a surface treatment method that uses an organic inhibitor. In this method, copper migration is inhibited by dipping the printed-circuit board, while heating under elevated pressure, in a solution that contains a metal deactivator or copper inhibitor. However, despite infiltration of the treatment agent while heating under elevated pressure, this method has difficulty achieving a uniform infiltration and as a result produces a variable migration resistance. In addition, even though the treatment agent infiltrates into the adhesion interface, etc., due to the application of heat and pressure, the durability of adhesion to the copper under high temperature/high humidity conditions is unsatisfactory.

Japanese Patent Application Laid Open [Kokai or Unexamined] Number Hei 5-65466 [65,466/1993] discloses a method that inhibits copper migration and improves anti-tracking through the addition of a triazinethiol copper inhibitor to the adhesive for the copper-clad laminate. While this type of adhesive does prevent copper migration in those regions where it directly contacts the copper, almost no effect is obtained in regions not in contact with the adhesive.

Thus, no surface treatment agent is currently available that is able to provide the surface of copper-containing metals with a satisfactory performance from all perspectives, i.e., oxidation resistance, migration resistance, solder resistance, and robustness of adherence.

DISCLOSURE OF THE INVENTION

Problems to be Solved by the Invention

The present invention takes as its object the introduction of a surface treatment agent that avoids at least some, and preferably all, of the problems described above for the prior art, or in specific terms that inhibits the susceptibility to oxidation and migration that is characteristic of copper-containing metals while, in its preferred embodiments, simultaneously achieving the solder resistance and durability of adhesion needed from surface treatment agents.

Description of the Invention, Including Preferred Embodiments

It has been discovered that the application of a surface treatment agent containing a silane coupling agent of certain particular types and at least one copper inhibitor to the surface of copper-containing metals can form a coating that gives an excellent performance in the areas of migration resistance, solder resistance, and durability of adherence. The present invention was achieved as a result of this discovery.

In specific terms, accordingly, in one of its embodiments the present invention relates to a composition for treating the surface of copper-containing metals, this composition comprising, preferably consisting essentially of, or more preferably consisting of, a dispersion or solution in water and organic solvent of (i) at least one silane coupling agent having a functional moiety selected from the group consisting of a vinyl moiety, a mercapto moiety, and an amino moiety, each of these moieties being bonded to one carbon atom of the silane coupling agent, and an epoxy moiety bonded to two adjacent carbon atoms of the silane coupling agent and (ii) at least one compound (hereinafter often denoted as a "copper inhibitor") selected from azole compounds, azine compounds, aromatic secondary amine compounds, and aromatic diacylhydrazide compounds.

Most of the preferred silane coupling agents for use in the present invention are compounds conforming to the following general chemical formula (I):

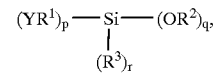

in which

Y represent a moiety selected from the group consisting of a mercapto moiety and an amino moiety, each of these moieties being bonded to a single carbon atom in moiety $R^1$, and an $\alpha,\beta$-epoxy moiety bonded to two adjacent carbon atoms in moiety $R^1$; and $R^1$ represents either (1) a saturated hydrocarbon moiety having: (1.1) two open valences if Y is not an $\alpha,\beta$-epoxy moiety and three open valences if Y is an $\alpha,\beta$-epoxy moiety; (1.2) a number of total carbon atoms that is at least 2, or preferably at least 3 and independently preferably is not more than, with increasing preference in the order given, 11, 10, 9, 8, 7, or 6; and (1.3) a number of carbon atoms, in the longest continuous chain of carbon atoms within said saturated hydrocarbon moiety that is between the moiety Y and the Si atom in general formula (I), that is at least 2, or preferably at least 3, and independently is not more than 8, or preferably is not more than 6 or (2) a moiety formally derived from a moiety as described in part (1) of this definition above by either (2.1) substituting an ether oxygen atom for one —$CH_2$— moiety therein, the carbon atom of which is a non-terminal member of the longest continuous chain of carbon atoms in the moiety as described in part (1) that is between the moiety Y and the Si atom in general formula (I) or (2.2) substituting a trivalent nitrogen atom for one

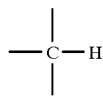

moiety therein, the carbon atom of which is a non-terminal member of the longest continuous chain of carbon atoms in the moiety as described in part (1) that is between the moiety Y and the Si atom in general formula (I);

each of $R^2$ and $R^3$, which may be the same or different, represent a methyl or an ethyl moiety; and each of p and q, which may be the same or different, represents one of the numbers 1, 2, and 3; r represents one of the numbers 0, 1, and 2; and p+q+r=4.

The moiety Y in general formula (I) is preferably bonded to the carbon atom of the $R^1$ moiety that is farthest from the Si atom in general formula (I), but may be bonded to a different carbon atom as long as the number of carbon atoms in the longest continuous chain between the Y moiety and the Si atom in general formula (I) satisfies the condition specified above. The $R^1$ moiety is exemplified by alkylene, a saturated hydrocarbon moiety with three open valences (for epoxy moiety bonding), and cyclopentylene or cyclohexylene. The $R^1$ moiety may be straight chain, cyclic, or branched chain, with straight chain being preferred. Preferred values for p, q, and r are p=1, q=2 or 3, and r=0 or 1.

The following compounds are specific, preferred examples of silane coupling agents with general formula (I):
(a) Epoxy-Containing Compounds
3-glycidyloxypropyltrimethoxysilane
3-glycidyloxypropylmethyldimethoxysilane
2-(3,4-epoxycyclohexyl)ethyltrimethoxysilane;
(b) Amino-Containing Compounds
N-(2-aminoethyl)-3-aminopropylethyldimethoxysilane
N-(2-aminoethyl)-3-aminopropyltrimethoxysilane
3-aminopropyltriethoxysilane;
(c) Mercapto-Containing Compounds
3-mercaptopropyltrimethoxysilane.

Silane coupling agents that do not conform to general formula (I) are still useful in the present invention if they conform to general formula (II):

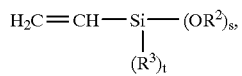

(II)

in which:
each of $R^2$ and $R^3$ has the same meaning as stated above for general formula (I);
s=1, 2, or 3, preferably 2 or 3, more preferably 3; and
t=(3-s).

Preferred examples of this type of silane coupling agents are:
(d) Vinyl-Containing Compounds
vinyltrimethoxysilane and vinyltriethoxysilane.

A surface treatment composition according to the present invention contains at least one and usually only one of the aforementioned silane coupling agents, although mixtures of two or more of the aforementioned silane coupling agents can also be used.

Among the copper inhibitors that can be used in a surface treatment composition according to the present invention, the azole compounds and azine compounds are exemplified by azoles and azines, which in each instance may carry 1 to 3, preferably 1 or 2, substituent moieties. Said substituent moieties are independently selected from the group consisting of: $C_1$ to $C_{12}$ straight chain and branched alkyl moieties, which preferably are short straight chain alkyl moieties such as methyl and ethyl; and from the following moieties: vinyl; benzyl; phenyl; tolyl; xylyl; naphthyl; methoxy; ethoxy; amino; phenylamino; N-(3-salicyloyl)amino; mercapto; mercaptomethyl; mercaptoethyl; —$CH_2$—$N(R^4)_2$, in which each $R^4$ moiety, which may be the same as or different from the other $R^4$ moiety in the formula, represents a $C_1$ to $C_8$, preferably a $C_4$ to $C_8$, straight chain or branched, preferably straight chain, alkyl moiety; and —$N(R^5)_2$, in which each $R^5$ moiety, which may be the same as or different from the other $R^5$ moiety in the formula, represents a $C_1$ to $C_6$, preferably a $C_1$ to $C_4$, straight chain or branched, preferably straight chain, alkyl moiety.

When the subject substituent is a mercapto moiety, the mercapto moiety may take the form of the salt with an alkali metal (preferably, primarily for reasons of economy, sodium or potassium). When two mercapto moieties are present, either or both of them may form salts.

The azoles under consideration are exemplified by imidazoles, pyrazoles, triazoles, and tetrazoles, in each instance possibly condensed with a benzene nucleus, among which imidazoles (including benzimidazoles), triazole (including benzotriazoles), and tetrazole are preferred. When salt formation is possible, the azole may take the form of the salt with an alkali metal (preferably, primarily for reasons of economy, sodium or potassium). The azines under consideration are exemplified by pyrimidines, pyrazines, pyridazines, triazines, and the like, with triazines being preferred.

Among the copper inhibitors usable in the surface treatment composition according to the present invention, the following are particularly preferred among aromatic secondary amine compounds: diphenylamines in which one of the phenyl moieties is substituted by a $C_4$ to $C_{10}$, preferably a $C_6$ to $C_{10}$, straight chain or branched, preferably straight chain, alkyl moiety, or by a benzene- or toluene-sulfonylamide moiety; and phenylenediamines in which both amino moieties are substituted by independent selections from $C_1$ to $C_6$, preferably $C_1$ to $C_4$, straight chain and branched alkyl moieties and phenyl, tolyl, xylyl, and naphthyl moieties.

Preferred among aromatic diacylhydrazide compounds are those conforming to general formula (III):

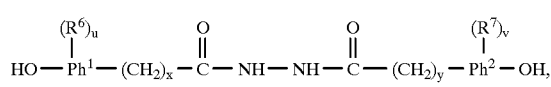

(III)

in which:
each $R^6$ or $R^7$ moiety, which may be the same as or different from any other $R^6$ or $R^7$ moiety, is selected from the group consisting of straight chain and branched alkyl moieties with from 1 to 4 carbon atoms each;
each of u and v, which may be the same or different, represents 1, 2, or 3;
$Ph^1$ represents a benzene ring minus (2+u) hydrogen atoms and $Ph^2$ represents a benzene ring minus (2+v) hydrogen atoms; and each of x and y, which may be the same or different, represents 2, 3, 4, or 5.

The following are preferred specific examples of copper inhibitor components for a surface treatment composition according to the present invention:

(a) Imidazoles 2-methylimidazole, 2-ethyl-4-methylimidazole, 1-benzyl-2-methylimidazole, 2-phenylimidazole, 2-phenyl-4-methylimidazole, undecylimidazole, 2-mercaptobenzimidazole, and 2-mercaptomethylbenzimidazole;

(b) Triazoles 1,2,3-triazole, 1,2,4-triazole, 1-phenyl-1,2,3-triazole, 2-phenyl-1,2,3-triazole, 1-phenyl-1,2,4-triazole, 3-(N-salicyloyl)amino-1,2,4-triazole, benzotriazole, tolyltriazole, the potassium salt of tolyltriazole, and the adduct of benzotriazole and 2-methylimidazole;

(c) Tetrazoles tetrazole, phenyltetrazole, mercaptotetrazole, [bis(2-ethylhexyl)aminomethylene]tetrazole, [bis(n-butyl)aminomethylene]tetrazole, [bis(n-hexyl)aminomethylene]tetrazole, and [bis(n-octyl)aminomethylene]tetrazole;

(d) Triazines 1,2,3-triazine, 1,2,4-triazine, 1,3,5-triazine, the monosodium salt of 1,3,5-triazine-2,4-dithiol, the monosodium salt of 6-dibutylamino-1,3,5-triazine-2,4-dithiol, 6-diethylamino-1,3,5-triazine-2,4-dithiol, 6-dimethylamino-1,3,5-triazine-2,4-dithiol, 6-methoxy-1,3,5-triazine-2,4-dithiol, 6-phenylamino-1,3,5-triazine-2,4-dithiol, and 2-vinyl-4,6-diamino-1,3,5-triazine;

(e) Aromatic Secondary Amines octylated diphenylamine, p-(p-toluenesulfonylamido)diphenylamine, N,N'-di-2-naphthyl-p-phenylenediamine, N-phenyl-N'-isopropyl-p-phenylenediamine, and N,N'-diphenyl-p-phenylenediamine;

(f) Aromatic Diacylhydrazide Compounds

N,N'-bis[3-(3,5-di-tert-butyl-4-hydroxyphenyl)propionyl]hydrazine.

A surface treatment composition according to the present invention contains at least one and usually only one of the above-described copper inhibitors, although mixtures of two or more of them can also be used.

Copper-containing metals are frequently held in high-temperature environments in the contemporary electronics industry, for example, in soldering operations. A high-melting copper inhibitor is preferably used in the surface treatment agent according to the present invention when this composition is used to treat such surfaces. Examples of high-melting copper inhibitors are 3-N-(salicyloyl)amino-1,2,4-triazole and N,N'-bis[3-(3,5-di-tert-butyl-4-hydroxyphenyl)propionyl]hydrazine.

A mixed solvent of water and organic solvent is preferably used to dissolve and/or disperse the silane coupling agent and copper inhibitor in a surface treatment composition according to the present invention. Any organic solvent that is itself sufficiently soluble and/or dispersible in water, that does not impair the functions of the silane coupling agent and copper inhibitor, that is capable of dissolving and/or dispersing the same, and that can be easily evaporated at ambient or elevated temperatures after application of the surface treatment composition may be used. This solvent may be any solvent ordinarily used in surface treatment agents for copper-containing metals, and, for example, the following are very suitably used: ketone solvents such as methyl ethyl ketone, methyl isopropyl ketone, methyl isobutyl ketone, acetone, and the like; aromatic hydrocarbon solvents such as benzene, toluene, xylene, and the like; alcohol solvents such as methanol, ethanol, isopropanol, and the like; Cellosove™ solvents (i.e., monoethers or monoesters of glycols, usually ethylene glycol) such as methyl Cellosolve™, ethyl Cellosolve™, butyl Cellosolve™, Cellosolve™ acetate, and the like; and dimethylformamide, dimethyl sulfoxide, and the like. Organic solvent is preferably used in an amount of 0.01 to 15 weight %, more preferably 1 to 10 weight %, or still more preferably 5 to 10 weight %, in each instance relative to the water in the mixed solvent.

The concentrations of each active component in a surface treatment composition according to the present invention will now be considered. The silane coupling agent is used at 0.01 to 30 weight %, or preferably at 0.08 to 25 weight %, relative to the water. The adhesive strength declines at below 0.01 weight %. At the other end of the range, no additional improvement in adhesive strength is observed for quantities added in excess of 30 weight %, which are therefore simply wasted. The copper inhibitor is used at 0.01 to 5 weight %, or preferably at 0.02 to 4 weight %, again relative to water. Additions below 0.01 weight % can not usually prevent copper migration and in particular result in a reduced adhesive strength upon being heated. No additional improvement in adhesive strength is observed for quantities added in excess of 5 weight %, which again are therefore simply wasted.

Independently of the actual concentrations, the silane coupling agent and copper inhibitor are preferably used in amounts such that the weight ratio of silane coupling agent to copper inhibitor is from 2.0:1.0 to 8.0:1.0, or more preferably from 4.0:1.0 to 6.0:1.0. The adhesive strength as a whole suffers from a decline when this ratio falls below 2.0:1.0, while a value for this ratio above 8.0:1.0 impairs the film-forming properties and degrades the heat resistance.

In addition to the essential components described above, a surface treatment composition according to the present invention may contain other additives conventionally used in surface treatment agents for copper-containing metals. Such additives are exemplified by metal salts and organic resins. Metal salts are used to improve the corrosion resistance, and to this end the metal in the salt preferably has a greater ionization tendency than copper. Zinc nitrate and aluminum phosphate are specific examples of such metal salts. Organic resins are used to impart flexibility to the coating, and water-soluble or water-dispersible olefin resins, inter alia, can be used for this purpose. Insofar as the benefits of the invention are not impaired, these additives when present preferably should be used in amounts as conventionally used to achieve the described objectives.

A surface treatment composition according to the present invention is typically prepared by dissolving or dispersing the silane coupling agent, copper inhibitor, and any optional additives in a mixture of the water and organic solvent.

A surface treatment composition according to the invention is employed to best advantage for the surface treatment of printed-circuit boards, where migration resistance, solder resistance, and robust adherence are critical issues. However, the surface treatment composition according to the present invention can also be used to treat the surface of the copper and/or copper alloy portions in various other copper-using materials—or to treat the surface of the copper and/or copper alloy that can or will be used in such materials—that are used in, for example, the electronics industry, electric wire and cable industry, automotive industry, etc., and for which at least one of the preceding improved properties is a requirement. All of these materials are suitable substrates for a process according to the invention. Furthermore, no narrow restrictions apply to the composition of a copper alloy to be treated, which encompasses, for example, brasses, bronzes, and the like.

No narrow restrictions apply to the technique for contacting the surface of the copper and/or copper alloy with a surface treatment composition according to the present invention, and those techniques ordinarily used with surface treatment agents, for example, dipping, spraying, roll coating, and the like, are suitable for a process according to the invention. Nor are the treatment temperature and treatment time critical considerations, but a temperature from 5° C. to 40° C. and a time from 0.1 to 60 seconds will ordinarily prove suitable. The substrate preferably should be dried after contact with a composition according to the invention, in order to evaporate off the water and organic solvent. No narrow restrictions apply to the drying technique and drying conditions. One suitable example consists of drying with hot air at 80° C. to 150° C.

A surface treatment composition according to the present invention can be used as a pre-treatment or post-treatment for copper-containing metals. For example, with respect to treatment of the surface of copper foil for printed-circuit boards, the composition may be coated on the copper foil prior to application of the foil to the printed-circuit board or may be coated on the copper foil regions of the printed-circuit board or over the entire printed-circuit board. In the former instance (prior application), the composition is preferably coated on the entire copper foil, i.e., both front and rear surfaces. In the latter instance, the composition may be coated on only the copper foil surfaces, but is preferably applied to these surfaces and to the regions bordering the material in contact with the copper foil, or to the entire printed-circuit board.

No narrow restrictions apply to the amount of surface treatment composition according to the present invention that is applied to the surface of the copper and/or copper alloy and any other area to be treated, but a coating add-on after drying of 1 to 1,000 mg/m$^2$ is preferred while 10 to 500 mg/m$^2$ is more preferred.

A surface treatment composition according to the present invention is most preferably applied directly to a surface of copper and/or copper alloy. However, the benefits of the present invention can also be indirectly induced by the addition of a composition according to the invention to material that will come into contact with the copper and/or copper alloy, for example, to compositions such as organic resin-containing adhesives.

The invention will be illustrated more specifically below through working examples, which, however, should not be taken as limiting the scope of the invention.

EXAMPLES

The substrate treated and the method for cleaning it before treating, which were the same in all the examples and comparison examples, were as follows.
(1) Substrate Used
Copper foil samples with a length of 50 mm, a width of 50 mm, and a thickness of 35 micrometers.
(2) Method for Cleaning
The dust and oil adhering on the surface of the copper foil were removed by spraying the surface with a moderately alkaline degreaser (FINECLEANER® 4336 from Nihon Parkerizing Company, Limited) using the following conditions: reagent concentration=18 g/L, treatment temperature=60° C., treatment time=20 seconds. The degreaser remaining on the surface was then washed off with tap water. The copper foil was subsequently dipped in 5% aqueous hydrochloric acid at ambient temperature for 3 minutes and its surface was thereafter washed with deionized water and dried with hot air.

Example 1

The copper foil, after cleaning by the method described above, was dipped for 20 seconds at room temperature in a surface treatment bath prepared by the addition to deionized water of 0.8 weight % of 3-glycidyloxypropyltrimethoxysilane, 0.02 weight % of 2-methylimidazole, and 10 weight % of methanol, the percentages in each instance being percentages of the amount of the deionized water. This was followed by draining and then drying with hot air until the foil reached a temperature of 100° C.

Example 2

The copper foil, after cleaning by the method described above, was roll coated with a surface treatment bath prepared by the addition to deionized water of 4.0 weight % of N-(2-aminoethyl)-3-aminopropyltrimethoxysilane, 1.0 weight % of 3-(N-salicyloyl)amino-1,2,4-triazole, and 10 weight % of methanol, the percentages in each instance being percentages of the amount of the deionized water. The copper foil was then dried with hot air to a foil temperature of 100° C.

Example 3

The copper foil, after cleaning by the method described above, was roll coated with a surface treatment bath prepared by the addition to deionized water of 10 weight % of 3-mercaptopropyltrimethoxysilane, 2.5 weight % of tetrazole, and 10 weight % of butyl Cellosolve™, the percentages in each instance being percentages of the amount of the deionized water. The copper foil was then dried with hot air to a foil temperature of 100° C.

Example 4

The copper foil, after cleaning by the method described above, was dipped for 5 seconds at room temperature in a surface treatment bath prepared by the addition to deionized water of 24.0 weight % of vinyltrimethoxysilane, 4.0 weight % of the monosodium salt of 1,3,5-triazine-2,4-dithiol, and 10 weight % of methanol, the percentages in each instance being percentages of the amount of the deionized water. This was followed by wipe-off with a wringer roll and then drying with hot air until the foil reached a temperature of 100° C.

Example 5

The copper foil, after cleaning by the method described above, was dipped for 20 seconds at room temperature in a surface treatment bath prepared by the addition to deionized water of 16.0 weight % of N-(2-aminoethyl)-3-aminopropyltrimethoxysilane, 4.0 weight % of N,N'-bis[3-(3,5-di-tert-butyl-4-hydroxyphenyl)propionyl]hydrazine, and 10 weight % of methanol, the percentages in each instance being percentages of the amount of the deionized water. This was followed by wipe-off with a wringer roll and then drying with hot air until the foil reached a temperature of 100° C.

Comparative Example 1

The copper foil, after cleaning by the method described above, was dipped for 20 seconds at room temperature in a comparative treatment bath prepared by the addition to deionized water of 5.0 weight % of 3-glycidyloxypropyltrimethoxysilane and 10 weight % of methanol, the percentages in each instance being percentages of the amount of the deionized water. This was followed by wipe-off with a wringer roll and then drying with hot air until the foil reached a temperature of 100° C.

Comparative Example 2

The copper foil, after cleaning by the method described above, was sprayed for 5 seconds at room temperature with a surface treatment bath prepared by the addition to deionized water of 5.0 weight % of 1,2,4-triazole and 10 weight % of methanol, the percentages in each instance being percentages of the amount of the deionized water. The copper foil was then squeegeed off with a wringer roll and dried with hot air until the foil reached a temperature of 100° C.

Comparative Example 3

The copper foil, after cleaning by the method described above, was sprayed for 1 second at room temperature with a surface treatment bath prepared by the addition to deionized water of 5.0 weight % of benzotriazole and 10 weight % of methanol, the percentages in each instance being percentages of the amount of the deionized water. The copper foil was then squeegeed off with a wringer roll and dried with hot air until the foil reached a temperature of 100° C.

Test Method 1

Copper Foil Delamination Strength (Evaluation of Adhesion Robustness)

An adhesive prepared by mixing 40 parts of Epikote™ 828 epoxy resin (product of Yuka Shell Epoxy Kabushiki Kaisha), 60 parts of Epikote™ 871 epoxy resin (product of Yuka Shell Epoxy Kabushiki Kaisha), and 15.5 parts of aminoethylpiperazine was coated on the copper foils treated in the working and comparative examples, and each copper foil was then pressed onto an epoxy resin-impregnated glass cloth substrate. These assemblies were hot-pressed for 16 hours at 74° C., which yielded an adhesive thickness of 5 micrometers.

Using the procedures in Japanese Industrial Standard (hereinafter usually abbreviated as "JIS") C-6481, the copper foil delamination strength was measured at ambient temperature (25° C.) on each of the resulting test specimens and was also measured after holding at 150° C. for 60 minutes.

Test Method 2

Solder Resistance

The solder resistance was evaluated in accordance with JIS C-6481 on test specimens prepared as described in Test Method 1. In this test, the particular test specimen was dipped for 30 seconds in molten solder (at 260° C.) and its appearance was then visually inspected and scored using the following scale:

+++: no abnormalities
++: less than 20% blistering or peeling
+: at least 20%, but less than 50% blistering or peeling
x: at least 50% blistering or peeling The results of both tests for all the Examples and Comparative Examples are shown in Table 1. Good results for both the copper foil delamination strength and solder resistance were obtained in invention Examples 1 to 5, while none of Comparative Examples 1 to 3 gave good results on all tests. In particular, the results for the copper foil delamination test were much worse in the Comparative Examples than in the working Examples.

TABLE 1

RESULTS OF THE EVALUATION TESTS

| Sample Identification | Delamination Strength in Kilograms per Square Centimeter, at: | | Solder Resistance Score |
|---|---|---|---|
| | 25° C. | 150° C. | |
| Example 1 | 2.5 | 1.0 | ++ |
| Example 2 | 2.5 | 1.1 | +++ |
| Example 3 | 2.3 | 0.9 | ++ |
| Example 4 | 2.5 | 1.0 | +++ |
| Example 5 | 2.7 | 1.1 | +++ |
| Comparative Example 1 | 2.2 | 0.4 | + |
| Comparative Example 2 | 2.0 | 0.5 | x |
| Comparative Example 3 | 2.0 | 0.5 | x |

Benefits of the Invention

Application of the surface treatment agent according to the present invention to copper-containing metals equips their surface with an excellent migration resistance, an excellent solder resistance, and a very durable adhesiveness.

The invention claimed is:

1. An aqueous liquid composition suitable for treating a surface of a copper-containing metal, said composition comprising water and:

(A) a component of dissolved, dispersed, or both dissolved and dispersed organic solvent;

(B) a component of a dissolved, dispersed, or both dissolved and dispersed silane coupling agent selected from the group consisting of silane coupling agents having a function moiety selected from the group consisting of vinyl, mercapto, amino, and epoxy moieties; and (C) a copper inhibitor component selected from the group consisting of azole compounds, azine compounds, aromatic secondary amine compounds, and aromatic diacylhydrazide compounds.

2. A composition according to claim 1, wherein component (B) is selected from the group consisting of vinyltrimethoxysilane, vinyltriethoxysilane, and materials corresponding to general formula (I):

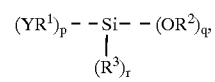

(I)

in which

Y represents a mercapto moiety or an amino moiety, each bonded to a single carbon atom in moiety $R^1$, or an α,β-epoxy moiety bonded to two adjacent carbon atoms in moiety $R^1$; $R^1$ represents either (1) a saturated hydrocarbon moiety having: (1.1) two open valences if Y is not an α,β-epoxy moiety and three open valences if Y is an α,β-epoxy moiety; (1.2) a number of total carbon atoms that is from 2 to 11; and (1.3) a number of carbon atoms, in the longest continuous chain of carbon atoms within said saturated hydrocarbon moiety that is between the moiety Y and the Si atom in general formula (I), that is from 2 to 8 or (2) a moiety formally derived from a moiety as described in part (1) of this definition above by either (2.1) substituting an ether oxygen atom for one —$CH_2$— moiety therein, the carbon atom of which is a non-terminal member of the longest continuous chain of carbon atoms in the moiety as described in part (1) that is between the moiety Y and the Si atom in general formula (I) or (2.2) substituting a trivalent nitrogen atom for one

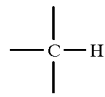

moiety therein, the carbon atom of which is a non-terminal member of the longest continuous chain of carbon atoms in the moiety as described in part (1) that is between the moiety Y and the Si atom in general formula (I);

each of $R^2$ and $R^3$, which may be the same or different, represent a methyl or an ethyl moiety; and each of p and q, which may be the same or different, represents one of the numbers 1, 2, or 3; r represents one of the numbers 0, 1, or 2; and p+q+r=4.

3. A composition according to claim 1, wherein components (C) is selected from the group consisting of:

(C.1) imidazoles, pyrazoles, triazoles, tetrazoles, benzimidazoles, benzotriazoles, pyrimidines, pyrazines, pyridazines, and triazines, all of which may be unsubstituted or may have from 1 to 3 substituent moieties which are, independently for each such substituent, selected from the group consisting of: $C_1$ to $C_{12}$ straight-chain and branched alkyl; vinyl; benzyl; phenyl; tolyl; xylyl; naphthyl; methoxy; ethoxy; amino; phenylamino; N-(3-salicyloyl)amino; mercapto; mercaptomethyl; mercaptoethyl; —$CH_2$—$N(R^4)_2$, in which each $R^4$ moiety, which may be the same as or different from the other $R^4$ moiety in the formula, represents a $C_1$ to $C_8$ straight chain or branched alkyl group; and —$N(R^5)_2$, in which each $R^5$ moiety, which may be the same as or different from the other $R^5$ moiety in the formula, represents a $C_1$ to $C_6$ straight chain or branched alkyl moiety;

(C.2) substituted diphenylamines in which one of the phenyl moieties is substituted by at least one $C_4$ to $C_{10}$ straight-chain or branched alkyl moiety or by a benzene- or toluene-sulfonylamide moiety;

(C.3) substituted phenylenediamines in which both amino moieties are substituted by at least one moiety from the group consisting of $C_1$ to $C_6$ straight chain and branched alkyl moieties and phenyl, tolyl, xylyl, and naphthyl moieties; and (C.4) aromatic diacylhydrazide compounds conforming to general formula (III)

(III)

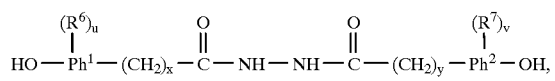

in which:

each $R^6$ or $R^7$ moiety, which may be the same as or different from any other $R^6$ or $R^7$ moiety, is selected from the group consisting of straight chain and branched alkyl moieties with from 1 to 4 carbon atoms each;

each of u and v, which may be the same or different, represents 1, 2, or 3;

$Ph^1$ represents a benzene ring minus (2+u) hydrogen atoms and $Ph^2$ represents a benzene ring minus (2+v) hydrogen atoms; and each of x and y, which may be the same or different, represents 2, 3, 4, or 5.

4. A composition according to claim 1, wherein component (C) is selected from the group consisting of:

(C.1) imidazoles, pyrazoles, triazoles, tetrazoles, benzimidazoles, benzotriazoles, pyrimidines, pyrazines, pyridazines, and triazines, all of which may be unsubstituted or may have from 1 to 3 substituent moieties which are, independently for each such substituent, selected from the group consisting of: $C_1$ to $C_{12}$ straight-chain and branched alkyl, vinyl, benzyl, phenyl, tolyl, xylyl, naphthyl, methoxy, ethoxy, amino, phenylamino, N-(3-salicyloyl)amino, mercapto, mercaptomethyl, mercaptoethyl, —$CH_2$—$N(R^4)_2$, in which each $R^4$ moiety, which may be the same as or different from the other $R^4$ moiety in the formula, represents a $C_1$ to $C_8$ straight chain or branched alkyl moiety; and —$N(R^5)_2$, in which each $R^5$ moiety, which may be the same as or different from the other $R^5$ moiety in the formula, represents a $C_1$ to $C_6$ straight chain or branched alkyl moiety;

(C.2) substituted diphenylamines in which one of the phenyl moieties is substituted by at least one $C_4$ to $C_{10}$ straight-chain or branched alkyl moiety or by a benzene- or toluene-sulfonylamide moiety;

(C.3) substituted phenylenediamines in which both amino moieties are substituted by at least one moiety from the group consisting of $C_1$ to $C_6$ straight chain and branched alkyl moieties and phenyl, tolyl, xylyl, and naphthyl moieties; and (C.4) aromatic diacylhydrazide compounds conforming to general formula (III)

(III)

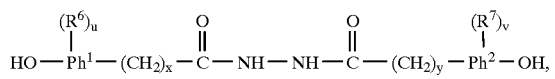

in which:

each $R^6$ or $R^7$ moiety, which may be the same as or different from any other $R^6$ or $R^7$ moiety, is selected from the group consisting of straight chain and branched alkyl moieties with from 1 to 4 carbon atoms each;

each of u and v, which may be the same or different, represents 1, 2, or 3;

$Ph^1$ represents a benzene ring minus 2+u hydrogen atoms and $Ph^2$ represents a benzene ring minus 2+v hydrogen atoms; and each of x and y, which may be the same or different, represents 2, 3, 4, or 5.

5. A composition according to claim 4, wherein: organic solvent component (A) is present in an amount from 0.01 to 15 weight %; silane coupling agent component (B) is present in an amount from 0.01 to 30 weight %; copper inhibitor component (C) is present in an amount from 0.01 to 5 weight %, the percentages in each instance being percentages of the water in the composition; and there is a ratio by weight of the amount of silane coupling agent component (B) to the amount of copper inhibitor component (C) from 2.0:1.0 to 8.0:1.0.

6. A composition according to claim 5, wherein: organic solvent component (A) is present in an amount from 5 to 10 weight %; silane coupling agent component (B) is present in an amount from 0.08 to 25 weight %; copper inhibitor component (C) is present in an amount from 0.02 to 4 weight %, the percentages in each instance being percentages of the water in the composition; and there is a ratio by weight of the amount of silane coupling agent component (B) to the amount of copper inhibitor component (C) from 4.0:1.0 to 6.0:1.0.

7. A composition according to claim 3, wherein: organic solvent component (A) is present in an amount from 0.01 to 15 weight %; silane coupling agent component (B) is present in an amount from 0.01 to 30 weight %; copper inhibitor component (C) is present in an amount from 0.01 to 5 weight %, the percentages in each instance being percentages of the water in the composition; and there is a ratio by weight of the amount of silane coupling agent component (B) to the amount of copper inhibitor component (C) from 2.0:1.0 to 8.0:1.0.

8. A composition according to claim 7, wherein: organic solvent component (A) is present in an amount from 5 to 10 weight %; silane coupling agent component (B) is present in an amount from 0.08 to 25 weight %; copper inhibitor component (C) is present in an amount from 0.02 to 4 weight %, the percentages in each instance being percentages of the water in the composition; and there is a ratio by weight of the amount of silane coupling agent component (B) to the amount of copper inhibitor component (C) from 4.0:1.0 to 6.0:1.0.

9. A composition according to claim 2, wherein: organic solvent component (A) is present in an amount from 0.01 to 15 weight %; silane coupling agent component (B) is present in an amount from 0.01 to 30 weight %; copper inhibitor component (C) is present in an amount from 0.01 to 5 weight %, the percentages in each instance being percentages of the water in the composition; and there is a ratio by weight of the amount of silane coupling agent component (B) to the amount of copper inhibitor component (C) from 2.0:1.0 to 8.0:1.0.

10. A composition according to claim 9, wherein: organic solvent component (A) is present in an amount from 5 to 10 weight %; silane coupling agent component (B) is present in an amount from 0.08 to 25 weight %; copper inhibitor component (C) is present in an amount from 0.02 to 4 weight %, the percentages in each instance being percentages of the water in the composition; and there is a ratio by weight of the amount of silane coupling agent component (B) to the amount of copper inhibitor component (C) from 4.0:1.0 to 6.0:1.0.

11. A composition according to claim 1, wherein: organic solvent component (A) is present in an amount from 0.01 to 15 weight %; silane coupling agent component (B) is present in an amount from 0.01 to 30 weight %; copper inhibitor component (C) is present in an amount from 0.01 to 5 weight %, the percentages in each instance being percentages of the water in the composition; and there is a ratio by weight of the amount of silane coupling agent component (B) to the amount of copper inhibitor component (C) from 2.0:1.0 to 8.0:1.0.

12. A composition according to claim 1, wherein: organic solvent component (A) is present in an amount from 5 to 10 weight %; silane coupling agent component (B) is present in an amount from 0.08 to 25 weight %; copper inhibitor component (C) is present in an amount from 0.02 to 4 weight %, the percentages in each instance being percentages of the water in the composition; and there is a ratio by weight of the amount of silane coupling agent component (B) to the amount of copper inhibitor component (C) from 4.0:1.0 to 6.0:1.0.

13. A process of treating a copper or copper alloy surface to form thereon a coating that increases at least one of resistance to oxidation of, resistance to migration of, solder resistance of, and durability of adhesion to, the copper or copper alloy surface by contacting the surface with a composition according to claim 12.

14. A process of treating a copper or copper alloy surface to form thereon a coating that increases at least one of resistance to oxidation of, resistance to migration of, solder resistance of, and durability of adhesion to, the copper or copper alloy surface by contacting the surface with a composition according to claim 11.

15. A process of treating a copper or copper alloy surface to form thereon a coating that increases at least one of resistance to oxidation of, resistance to migration of, solder resistance of, and durability of adhesion to, the copper or copper alloy surface by contacting the surface with a composition according to claim 10.

16. A process of treating a copper or copper alloy surface to form thereon a coating that increases at least one of resistance to oxidation of, resistance to migration of, solder resistance of, and durability of adhesion to, the copper or copper alloy surface by contacting the surface with a composition according to claim 9.

17. A process of treating a copper or copper alloy surface to form thereon a coating that increases at least one of resistance to oxidation of, resistance to migration of, solder resistance of, and durability of adhesion to, the copper or copper alloy surface by contacting the surface with a composition according to claim 7.

18. A process of treating a copper or copper alloy surface to form thereon a coating that increases at least one of resistance to oxidation of, resistance to migration of, solder resistance of, and durability of adhesion to, the copper or copper alloy surface by contacting the surface with a composition according to claim 3.

19. A process of treating a copper or copper alloy surface to form thereon a coating that increases at least one of resistance to oxidation of, resistance to migration of, solder resistance of, and durability of adhesion to, the copper or copper alloy surface by contacting the surface with a composition according to claim 2.

20. A process of treating a copper or copper alloy surface to form thereon a coating that increases at least one of resistance to oxidation of, resistance to migration of, solder resistance of, and durability of adhesion to, the copper or copper alloy surface by contacting the surface with a composition according to claim 1.

* * * * *